US008288290B2

(12) United States Patent
Carothers

(10) Patent No.: US 8,288,290 B2
(45) Date of Patent: Oct. 16, 2012

(54) INTEGRATION CMOS COMPATIBLE OF MICRO/NANO OPTICAL GAIN MATERIALS

(75) Inventor: Daniel N. Carothers, Oro Valley, AZ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 755 days.

(21) Appl. No.: 12/201,618

(22) Filed: Aug. 29, 2008

(65) Prior Publication Data
US 2010/0055919 A1     Mar. 4, 2010

(51) Int. Cl.
*H01L 21/302* (2006.01)
(52) U.S. Cl. .............. 438/718; 257/14; 216/37
(58) Field of Classification Search .......... 438/718; 257/14; 216/37
See application file for complete search history.

(56) References Cited

U.S. PATENT DOCUMENTS

| | | |
|---|---|---|
| 4,420,258 A | 12/1983 | Burns et al. |
| 4,547,072 A | 10/1985 | Yoshida et al. |
| 4,748,617 A | 5/1988 | Drewlo |
| 4,921,354 A | 5/1990 | SooHoo |
| 5,165,001 A | 11/1992 | Takagi et al. |
| 5,281,805 A | 1/1994 | Sauer |
| 5,371,591 A | 12/1994 | Martin et al. |
| 5,430,755 A | 7/1995 | Perlmutter |
| 5,625,636 A | 4/1997 | Bryan et al. |
| 5,674,778 A | 10/1997 | Lee et al. |
| 5,703,989 A | 12/1997 | Khan et al. |
| 5,736,461 A | 4/1998 | Berti et al. |
| 5,828,476 A | 10/1998 | Bonebright et al. |
| 5,834,800 A | 11/1998 | Jalali-Farahani et al. |
| 5,914,496 A | 6/1999 | Thijs et al. |
| 6,117,771 A | 9/2000 | Murphy et al. |
| 6,242,324 B1 | 6/2001 | Kub et al. |
| 6,306,722 B1 | 10/2001 | Yang et al. |
| 6,331,445 B1 | 12/2001 | Janz et al. |
| 6,387,720 B1 | 5/2002 | Misheloff et al. |
| 6,400,996 B1 | 6/2002 | Hoffberg et al. |
| 6,434,180 B1 | 8/2002 | Cunningham |
| 6,477,285 B1 | 11/2002 | Shanley |

(Continued)

FOREIGN PATENT DOCUMENTS

EP     0 818 693 A1     1/1998

(Continued)

OTHER PUBLICATIONS

J.Van Campenhout et al. Proc. Optical Society of America (2007) pp. 1-3.*

(Continued)

*Primary Examiner* — Lan Vinh
*Assistant Examiner* — Maki Angadi
(74) *Attorney, Agent, or Firm* — Maine Cernota & Rardin; Andrew P. Cernota

(57) ABSTRACT

A method is provided for the integration of an optical gain material into a Complementary metal oxide semiconductor device, the method comprising the steps of: configuring a workpiece from a silicon wafer upon which is disposed an InP wafer bearing an epitaxy layer; mechanically removing the InP substrate; etching the InP remaining on epitaxy layer with hydrochloric acid; depositing at least one Oxide pad on revealed the epitaxy layer; using the Oxide pad as a mask during a first pattern etch removing the epitaxy to an N level; etching with a patterned inductively coupled plasma (ICP) technique; isolating the device on the substrate with additional pattern etching patterning contacts, applying the contacts.

1 Claim, 14 Drawing Sheets

U.S. PATENT DOCUMENTS

| | | | |
|---|---|---|---|
| 6,605,809 B1 | 8/2003 | Engels et al. |
| 6,677,655 B2 | 1/2004 | Fitzgerald |
| 6,680,495 B2 | 1/2004 | Fitzgerald |
| 6,687,987 B2 | 2/2004 | Mayer et al. |
| 6,725,119 B1 | 4/2004 | Wake |
| 6,738,546 B2 | 5/2004 | Deliwala |
| 6,785,447 B2 | 8/2004 | Yoshimura et al. |
| 6,795,622 B2 | 9/2004 | Forrest et al. |
| 6,850,252 B1 | 2/2005 | Hoffberg |
| 6,861,369 B2 | 3/2005 | Park |
| 6,936,839 B2 | 8/2005 | Taylor |
| 6,968,110 B2 | 11/2005 | Patel et al. |
| 7,006,881 B1 | 2/2006 | Hoffberg et al. |
| 7,010,208 B1 | 3/2006 | Gunn, III et al. |
| 7,043,106 B2 | 5/2006 | West et al. |
| 7,072,556 B1 | 7/2006 | Gunn, III et al. |
| 7,082,247 B1 | 7/2006 | Gunn, III et al. |
| 7,103,252 B2 | 9/2006 | Ide |
| 7,139,448 B2 | 11/2006 | Jain et al. |
| 7,215,845 B1 | 5/2007 | Chan et al. |
| 7,218,809 B2 | 5/2007 | Zhou et al. |
| 7,218,826 B1 | 5/2007 | Gunn, III et al. |
| 7,259,031 B1 | 8/2007 | Dickinson et al. |
| 7,272,279 B2 | 9/2007 | Ishikawa et al. |
| 7,315,679 B2 | 1/2008 | Hochberg et al. |
| 7,333,679 B2 | 2/2008 | Takahashi |
| 7,348,230 B2 | 3/2008 | Matsuo et al. |
| 7,356,221 B2 | 4/2008 | Chu et al. |
| 2003/0020144 A1 | 1/2003 | Warble et al. |
| 2003/0026546 A1 | 2/2003 | Deliwala |
| 2003/0183825 A1 | 10/2003 | Morse |
| 2004/0146431 A1 | 7/2004 | Scherer et al. |
| 2004/0190274 A1 | 9/2004 | Saito et al. |
| 2005/0094938 A1 | 5/2005 | Ghiron et al. |
| 2006/0105509 A1 | 5/2006 | Zia et al. |
| 2006/0146902 A1* | 7/2006 | Ikoma et al. ............ 372/43.01 |
| 2006/0158723 A1 | 7/2006 | Voigt et al. |
| 2006/0238866 A1 | 10/2006 | Von Lerber |
| 2006/0240667 A1 | 10/2006 | Matsuda et al. |
| 2007/0116398 A1 | 5/2007 | Pan et al. |
| 2007/0170417 A1* | 7/2007 | Bowers ........................ 257/14 |
| 2007/0202254 A1 | 8/2007 | Ganguli et al. |
| 2008/0159751 A1 | 7/2008 | Matsui et al. |
| 2008/0240180 A1 | 10/2008 | Matsui et al. |

FOREIGN PATENT DOCUMENTS

| | | |
|---|---|---|
| EP | 1 067 409 A2 | 1/2001 |
| WO | 93/14514 | 7/1993 |
| WO | 01/27669 A1 | 4/2001 |
| WO | 02/16986 A1 | 2/2002 |
| WO | 2004/088724 A2 | 10/2004 |
| WO | 2007/149055 A1 | 12/2007 |

OTHER PUBLICATIONS

Roth, Jonathan Edgar, "Electroabsorption Modulators for CMOS Compatible Optical Interconnects in III-V and Group IV Materials", Stanford University, Aug. 2007, 209 pages.

Pruessner, Marcel W. et al. "InP-Based Optical Waveguide MEMS Switches with Evanescent Coupling Mechanism", Journal of Microelectromechanical Systems, Oct. 2005, pp. 1070-1081; vol. 14, No. 5.

IBM TDB; "Integrated Process for Silicon Nitride Waveguide Fabrication"; IBM Technical Disclosure Bulletin, Jul. 1990, pp. 156-157.

Matsushita, A. et al., "Narrow $CoSi_2$ Line Formation on $SiO_2$ by Focused Ion Beam", IEEE, 1999, pp. 861-864.

Kimerling, L.C. et al., "Electronic-Photonic Integrated Circuits on the CMOS Platform", Silicon Photonics, 10 pages, vol. 6125.

Liu, Jifeng et al., "Design of Monolithically Integrated GeSi Electro-Absorption Modulators and Photodetectors on an SOI Platform", Optics Express, 2007, pp. 623-628, vol. 15, No. 2.

Fijol, J.J. et al., "Fabrication of Silicon-On-Insulator Adiabatic Tapers for Low Loss Optical Interconnection of Photonic Devices", SPIE, 2003, 14 pgs.

Yap, D. et al., "Integrated Optoelectronic Circuits with InP-Based HBTs", Optoelectrical Integrated Circuits and Packaging V, Proceedings of SPIE, 2001, pp. 1-11, vol. 4290.

Roth, Jonathan Edgar, "Electroabsorption Modulators for CMOS Compatible Optical Interconnects in III-V and Group IV Materials", Submitted to the Dept. of Electrical Eng. and the Committee on Graduate Studies of Stanford University, Aug. 2007, 207 pgs.

Okyay, Ali K. et al., "Silicon Germanium CMOS Optoelectronic Switching Device: Bringing Light to Latch", IEEE Transactions on Electron Devices, 2007, pp. 3252-3259, vol. 54, No. 12.

McAulay, Alastair D., "All-Optical Switching and Logic with an Integrated Optic Microing Resonator", Proc. of SPIE, 2005, pp. 16-22, vol. 5814.

Chao, Fang-Lin et al., "Analysis of Temperature Profiles of Thermo-Optic Waveguides", Fiber and Integrated Optics, 1994, pp. 397-406, vol. 13.

Kik, P.G. et al., "Erbium Doped Optical Waveguide Amplifiers on Silicon", MRS Bulletin, Apr. 1998, 7 pgs.

"Chapter 13: Process Integration", National Tiapei University of Technology.

L.C. Kimerling et al., "Electronic-Photonic Integrated Circuits on the CMOS Platform", Joint Report sponsored under Defense Advanced Research Projects Agency's EPIC Program and executed by the Microsystems Technology Office, ARPA Order No. T239/03, Program code 4H20 (no date of publication), pp. 1-10.

J.S. Kimmet, "Chapter 6—Integrated Circuit Fabrication Details", M.S. Thesis, 18 pgs.

PCT Search Report dated Oct. 20, 2009 of Patent Application No. PCT/US09/55152 filed Aug. 27, 2009.

* cited by examiner

Starting from just after contact and gate salicidation step

Dielectric Deposition and CMP to re-planerize surface

Deposit and Etch deposited silicon waveguide material.

Deposit SIO2 and CMP Back to near top of guide.

(Deposit coupling, bond layer of SIO2. or leave enough SiO2 surface to ensure bond.)

Ziptronix bond of InP Epi Materials,

Bond diced materials to allow improved alignment and work within bounds of exsisting InP substrate material, will also allow different materials to be bonded to the different die on the same wafer facilitating a wider range of testable structures.

InP Substrates are mechanically thinned to less than 20um

A HCL based etch is used to remove remaining InP substrate to InGaAs etch stop.
(HCL should not erode remaining SiO2 Surface.)

Epitaxy is patterned and etched (2 step, 1st to lower contact 2nd for Isolation

Top Contact, spacer (if needed) and lower contact Metals are applied

Cladding oxide is applied and planerised.

Vias are cut, Filled and Polished. (Employ 2 layers of via)

Deposit and cut Metal 1

INTEGRATION CMOS COMPATIBLE OF MICRO/NANO OPTICAL GAIN MATERIALS

FIELD OF THE INVENTION

The invention relates to micro/nano gain materials, and more particularly, to the integration thereof into complementary metal oxide semiconductor devices.

BACKGROUND OF THE INVENTION

Integrated optical systems, such as optical bus architectures and ultra-stable nano RF local oscillators are composed of fundamental device structures requiring improved integrated optical gain materials. In the past, InGaAlAs/InGaAs laser structure have been over looked as laser materials because as the TM and TE absorption is roughly equal and while it demonstrates exceptional gain for photons absorbed through the TE mode, the gain through TM absorption is zero. While in traditional configurations, this would be detrimental in the formation of lasers and amplifiers having a standard geometry, in a highly confined optical environment in which the TE can be selectively guided this becomes a significant advantage.

SUMMARY OF THE INVENTION

One embodiment of the present invention will provide an InGaAlAs/InGaAs laser structure to achieve a unique integrated gain structure.

One embodiment of the present invention provides a method for the integration of an optical gain material into a Complementary metal oxide semiconductor device, the method comprising the steps of: configuring a workpiece from a silicon wafer upon which is disposed an InP wafer bearing an epitaxy layer; mechanically removing the InP substrate; etching the InP remaining on epitaxy layer with hydrochloric acid; depositing at least one Oxide pad on revealed epitaxy layer; using the Oxide pad as a mask during a first pattern etch removing the epitaxy to an N level; etching with a patterned inductively coupled plasma (ICP) technique; isolating the device on the substrate with additional pattern etching patterning contacts, appling the contacts.

Another embodiment of the present invention provides such a method further comprising planarization of the epitaxy layer.

A further embodiment of the present invention provides such a method further comprising bonding the epitaxial surface to the silicon wafer.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
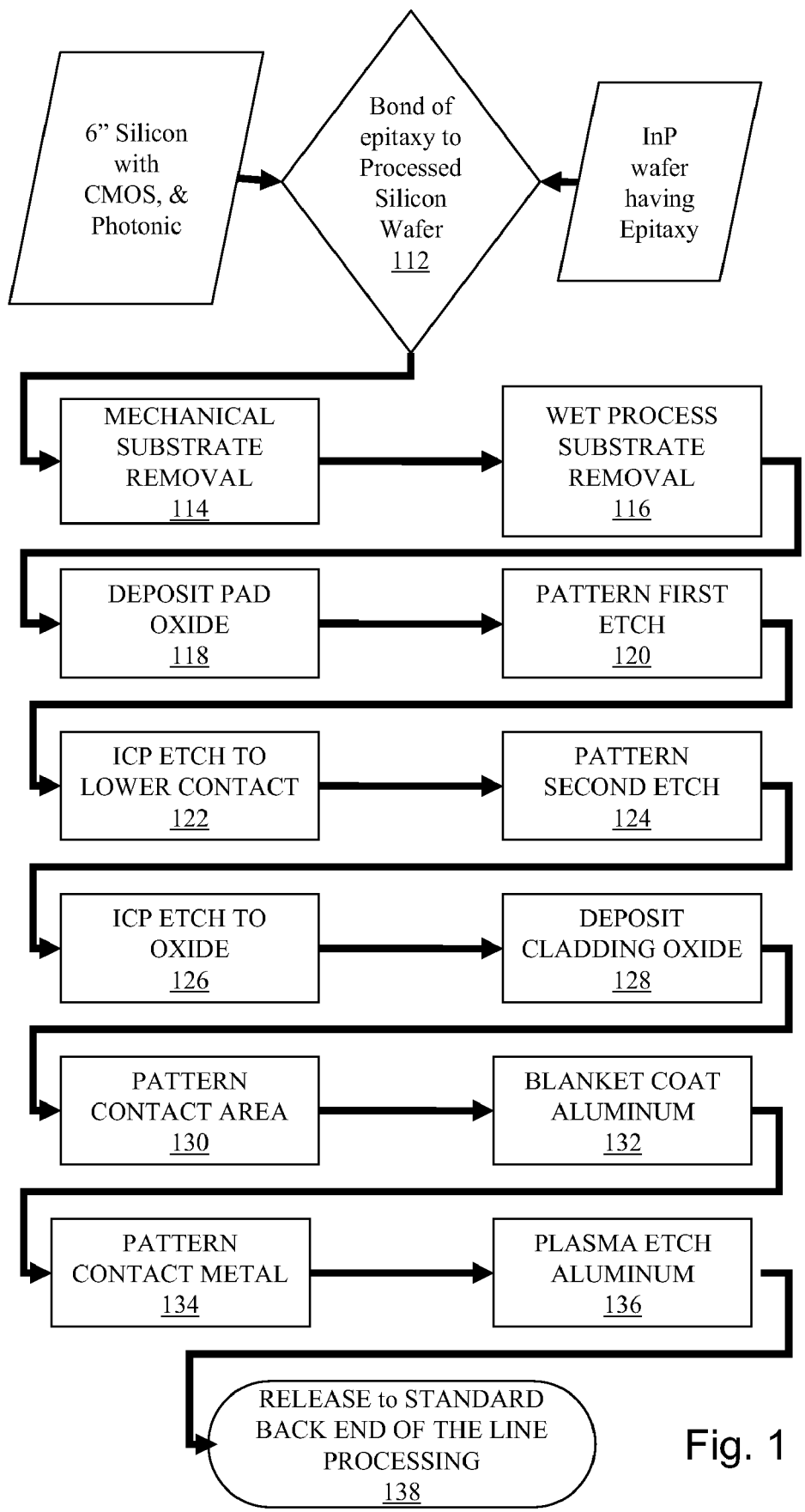
FIG. 1 is a flow chart illustrating a method for the integration of a gain material configured in accordance with one embodiment of the present invention.
Figure 2A:
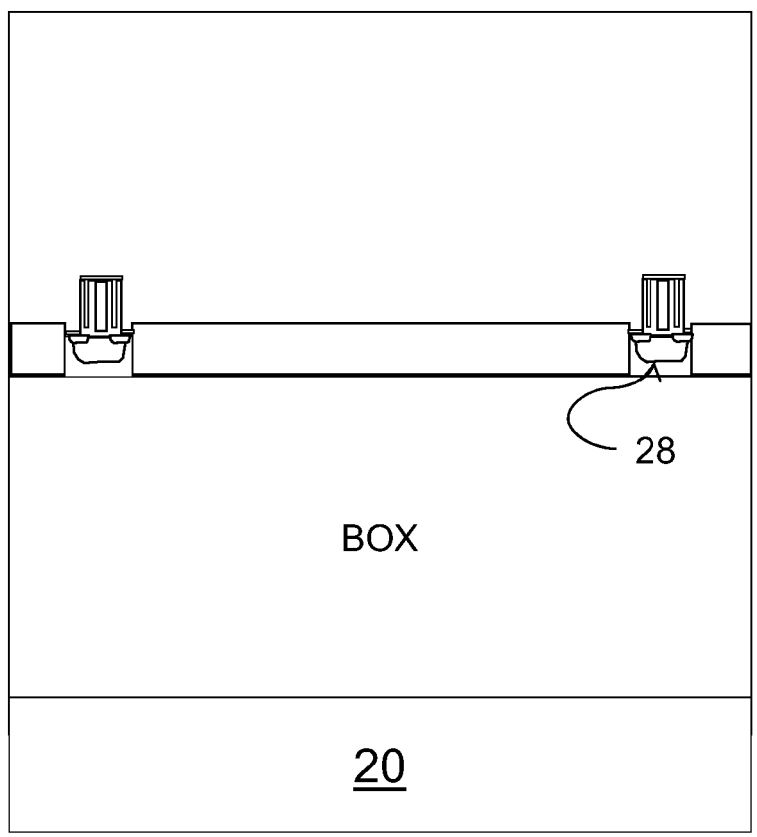
FIG. 2A is an elevation view of CMOS substrate illustrating a step in a method for the integration of a gain material configured in accordance with one embodiment of the present invention.
Figure 2B:
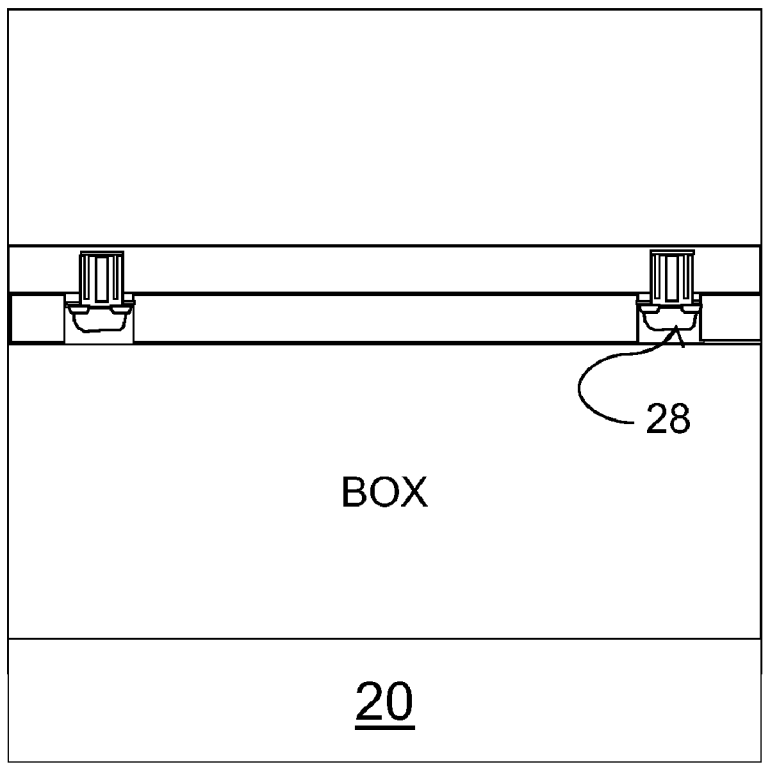
FIG. 2B is an elevation view of planarization of a surface of a CMOS substrate illustrating a step in a method for the integration of a gain material configured in accordance with one embodiment of the present invention.
Figure 2C:
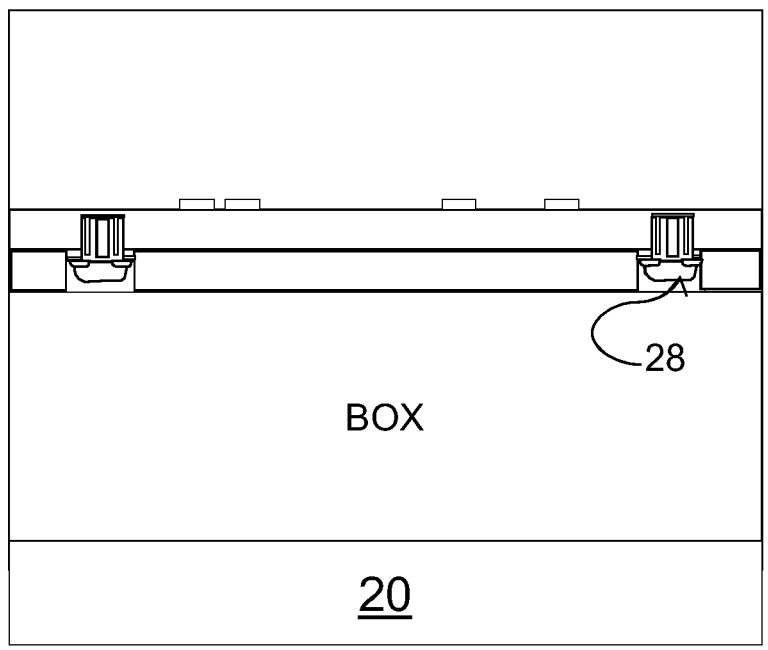
FIG. 2C is an elevation view of CMOS substrate and silicon waveguides illustrating a step in a method for the integration of a gain material configured in accordance with one embodiment of the present invention.
Figure 2D:
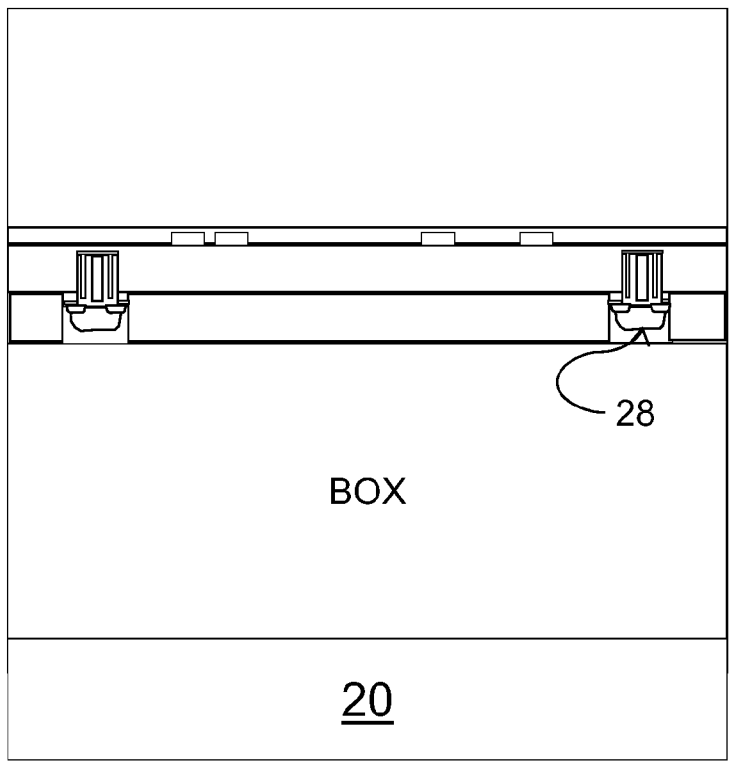
FIG. 2D is an elevation view of CMOS substrate and planarized waveguides illustrating a step in a method for the integration of a gain material configured in accordance with one embodiment of the present invention.
Figure 2E:
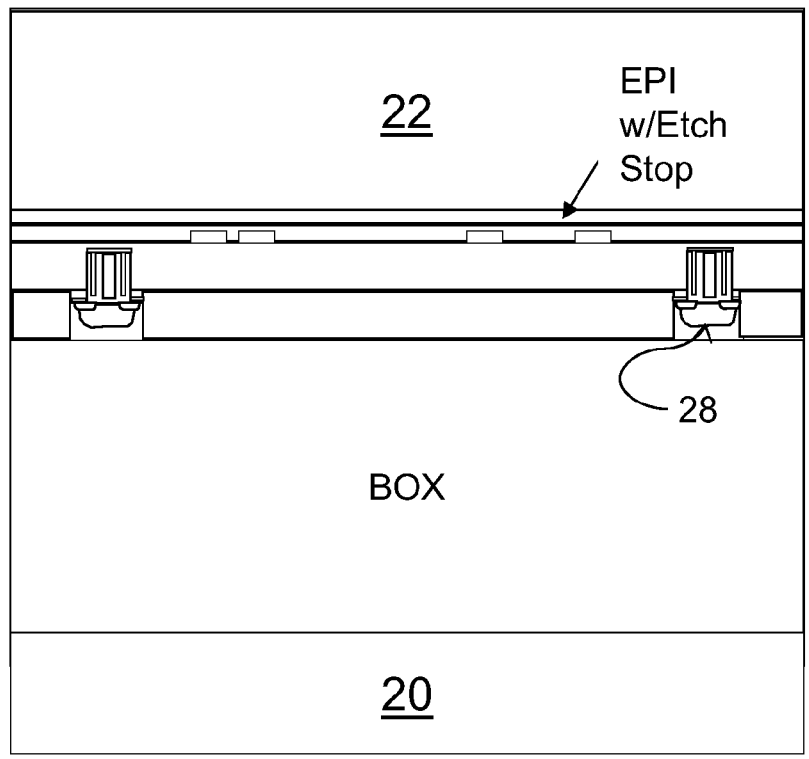
FIG. 2E is an elevation view of CMOS substrate and InP Epitaxy layer illustrating a step in a method for the integration of a gain material configured in accordance with one embodiment of the present invention.
Figure 2F:
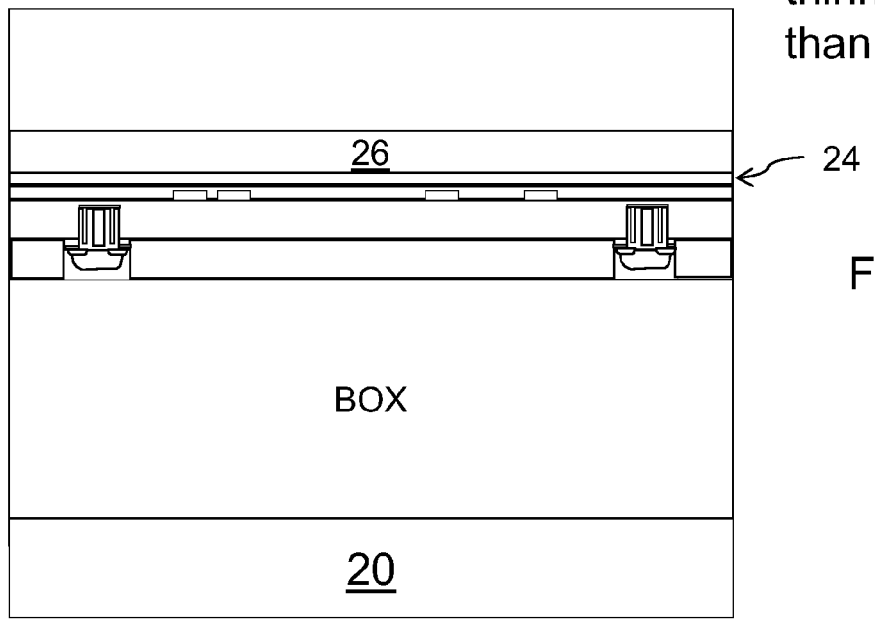
FIG. 2F is an elevation view of CMOS substrate and mechanically thinned InP Epitaxy layer illustrating a step in a method for the integration of a gain material configured in accordance with one embodiment of the present invention.
Figure 2G:
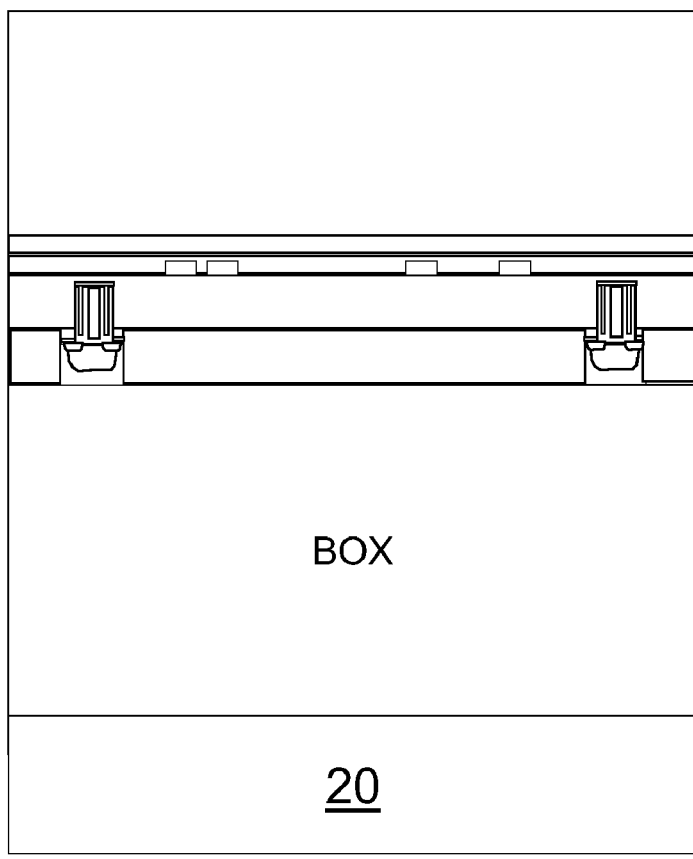
FIG. 2G is an elevation view of CMOS substrate and InGaAs etch stop layer illustrating a step in a method for the integration of a gain material configured in accordance with one embodiment of the present invention.
Figure 2H:
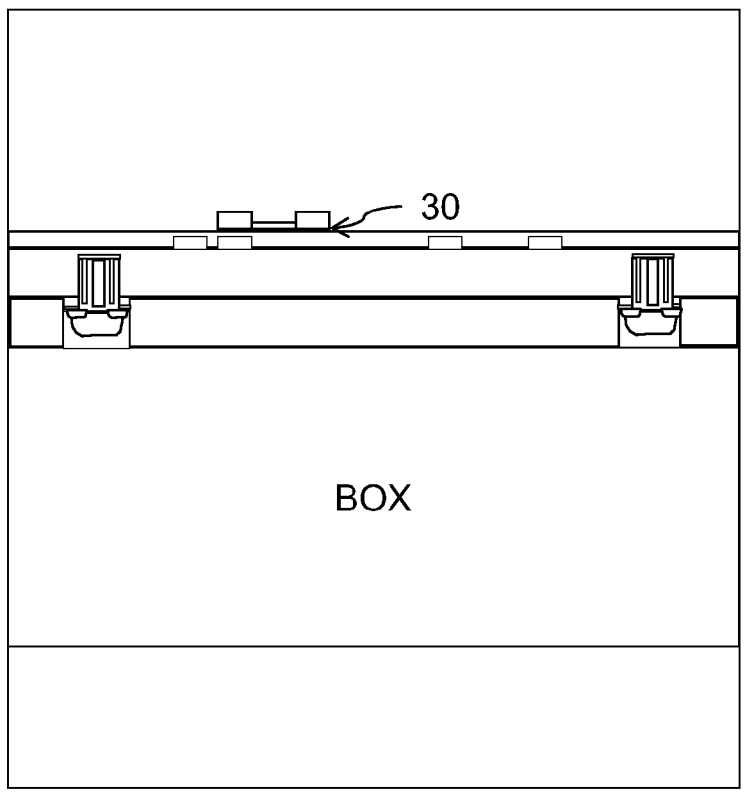
FIG. 2H is an elevation view of CMOS substrate and etched Epitaxy layer illustrating a step in a method for the integration of a gain material configured in accordance with one embodiment of the present invention.
Figure 2I:
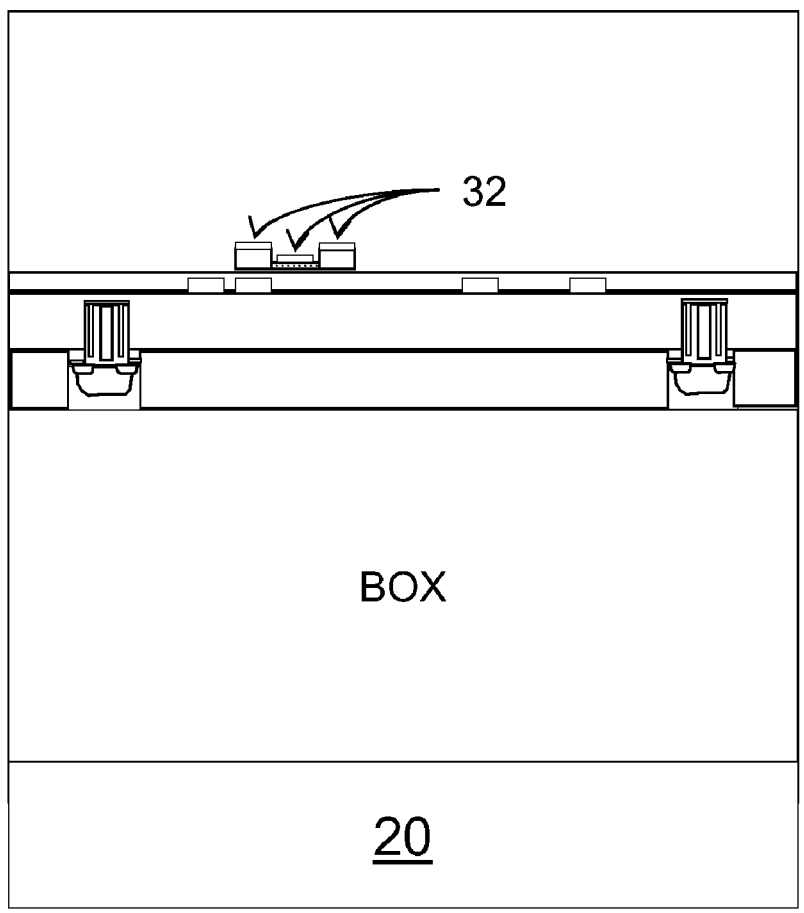
FIG. 2I is an elevation view of CMOS substrate and etched Epitaxy layer with top contacts illustrating a step in a method for the integration of a gain material configured in accordance with one embodiment of the present invention.
Figure 2J:
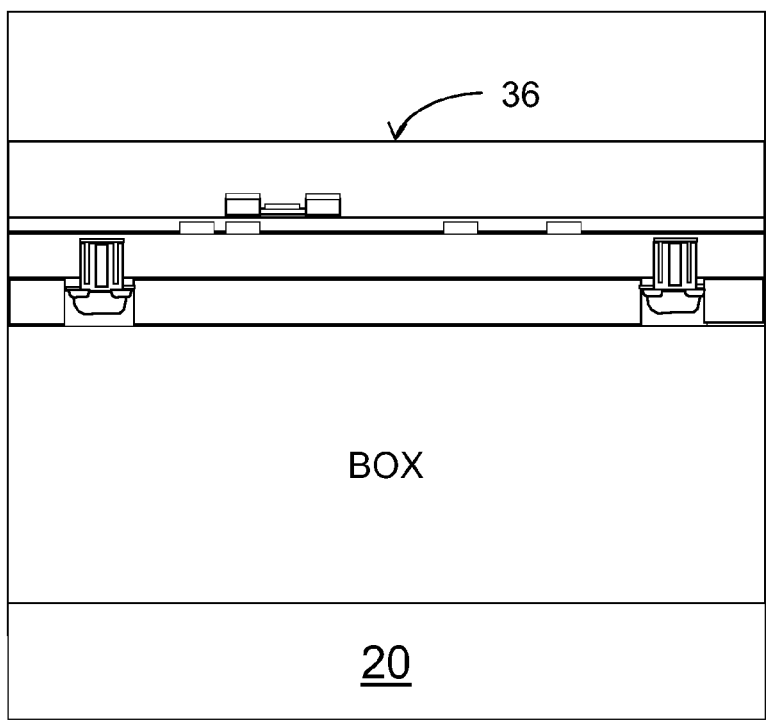
FIG. 2J is an elevation view of CMOS substrate and cladding oxide illustrating a step in a method for the integration of a gain material configured in accordance with one embodiment of the present invention.
Figure 2K:
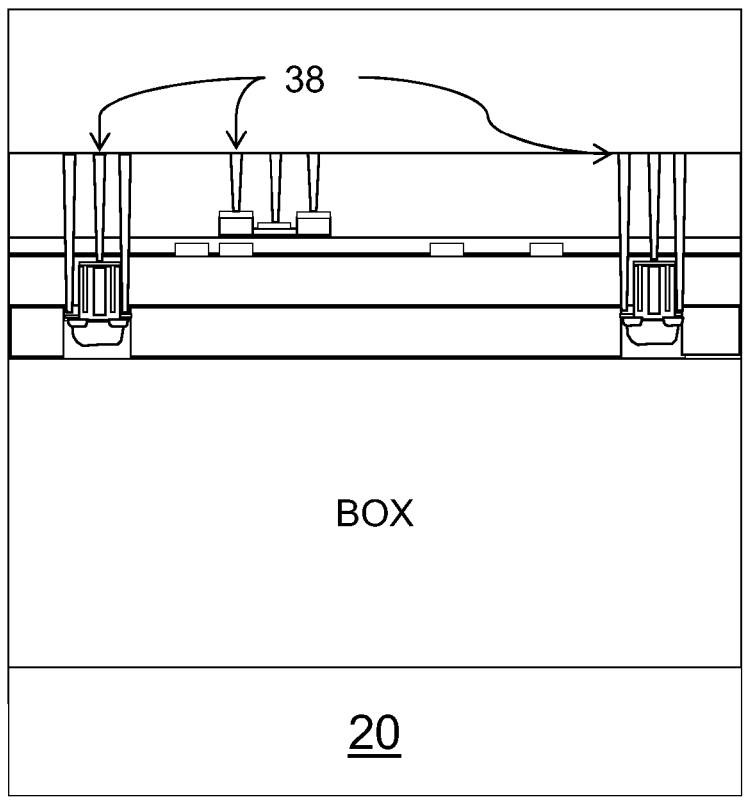
FIG. 2K is an elevation view of CMOS substrate and with vias cut in a cladding oxide layer illustrating a step in a method for the integration of a gain material configured in accordance with one embodiment of the present invention.
Figure 2L:
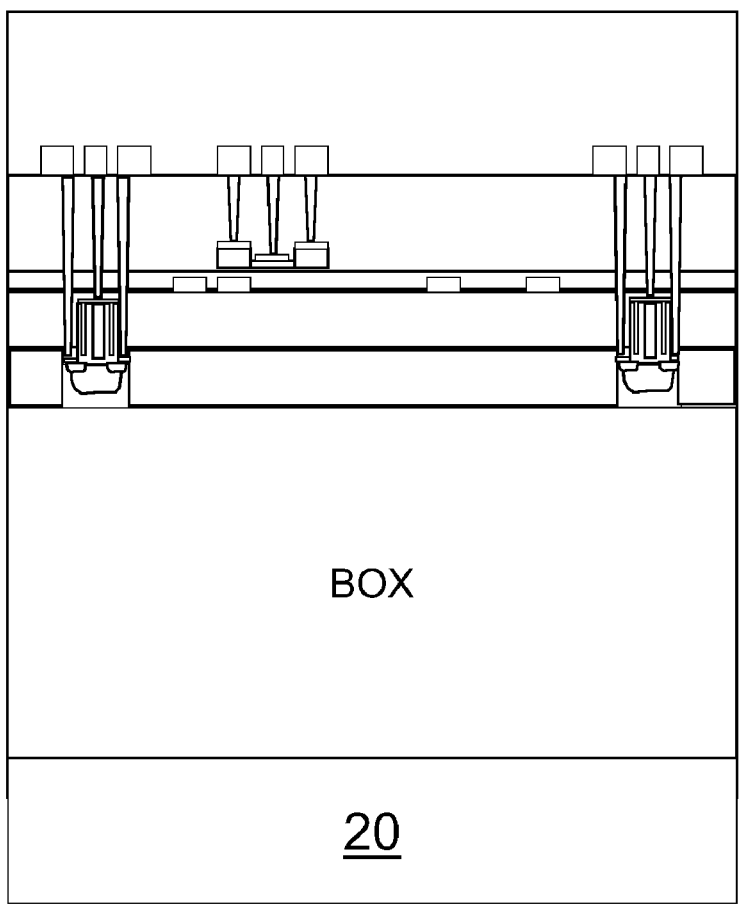
FIG. 2L is an elevation view of CMOS substrate and metal deposition illustrating a step in a method for the integration of a gain material configured in accordance with one embodiment of the present invention.
Figure 2M:
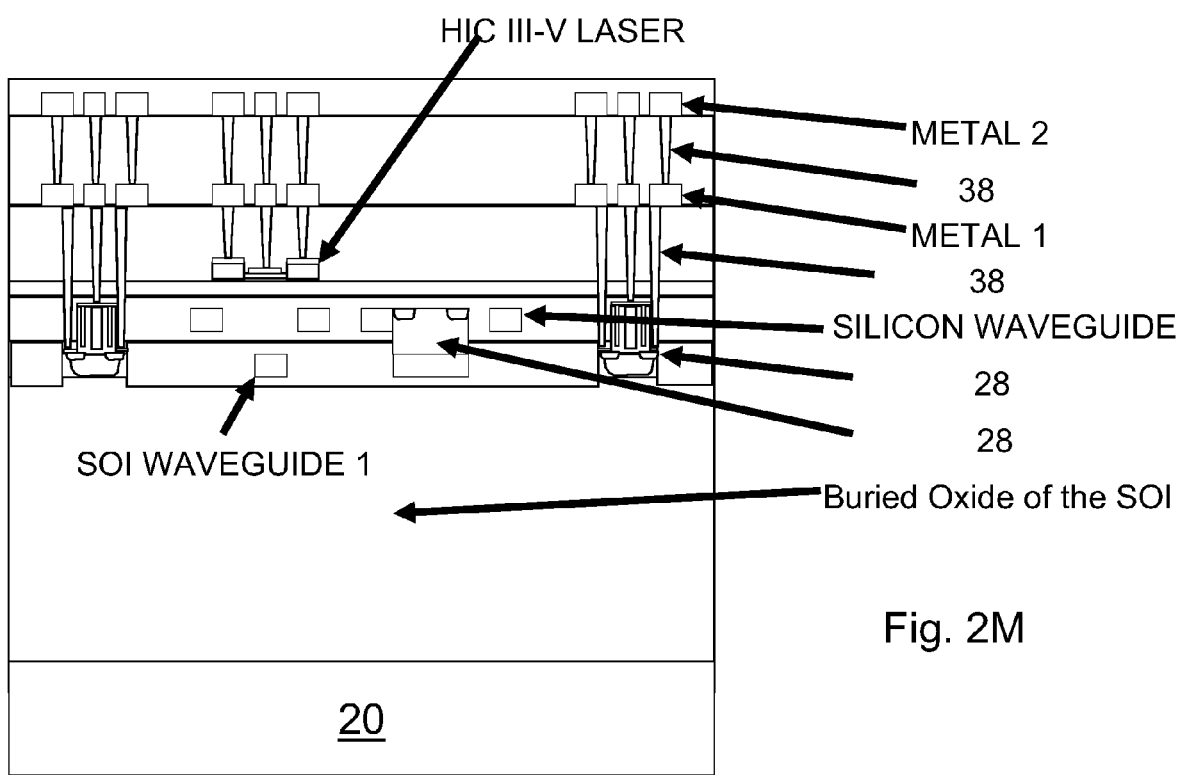
FIG. 2M is an elevation view of a CMOS device with integrate gain material configured in accordance with one embodiment of the present invention.

In one embodiment, a InGaAlAs/InGaAs complementary metal oxide semiconductor (CMOS) compatible micro/nano optical gain material is provided for integration into a CMOS device. Such a gain material may be utilized in an environment with a high level of optical and electrical confinement.

The crystal structure of such a gain material provides good conversion efficiency within the small volume devices and low material absorption due to the InGaAlAs guiding and contacting structure and the low loss guiding structure combined with the highly confined Transverse Electric (TE) only optical structures has additional benefits in regards to the interaction (absorption) cross section of the optical field and quantum well and the low loss TE nature of the fabricated devices. In addition to its outstanding optical properties, this material system provides excellent ohmic contact with aluminum based CMOS metallization allowing for efficient current injection while ensuring adherence to a CMOS compatible process.

There are many advantages to the use of InGaAlAs gain material. For example, the interfaces between epitaxial layers can be tailored to be more abrupt for AlGaInAs since there is only one group V element to control. For this same reason, it is also easier to grow graded layers in this system. Interfaces between graded layers are also thermally stable which is not the case for competing GaInAsP materials. This is critical for the formation of optical structures that must endure the post processing of a CMOS process. This ability to handle high-temperature processing steps, such as plasma deposition, diffusion, and annealing are key to the development of a reliable optical gain material that can be integrated as part of the overall epic process.

The InGaAlAs quaternary alloys are also better suited to conventional Molecular Beam Epitaxy (MBE) than InGaAsP due to lack of reliable phosphorous solid or gas source. By employing MBE the user is able to better control the material composition and configuration of very thin epitaxial structures than would be possible with Metalorganic vapour phase epitaxy (MOCVD), although one skilled in the art will appreciated that this technique may be employed in some embodiments of the present invention. This level of control is important to the goal of achieving a combination of controlled gain as well as material thickness from our devices allowing us to develop uniform devices having characterizable performance.

The use of quaternaries has benefits over the simpler ternary InAlAs/InGaAs systems in that they have a larger range of lattice matched energies and can be used to maximize the conduction and valance band offsets. The larger conduction band offset of the InGaAlAs system has the following benefits:

For a given emitting wavelength, larger well thickness can be used in the InGaAlAs/InGaAs system leading to a greater optical absorption;

Interfaces at the well can be made very abrupt because there is only one group V element that has to be controlled at the transition; and The InGaAlAs/InGaAs system provides better confinement of the free electron gas in the wells leads to higher optical gain per well, by decreasing the gain broadening due to coupling between electron levels from well to well, and by reducing the electron spill out from the wells into the optical guiding region at high injection levels.

One embodiment of the presentation provides an approach for molecular bonding allowing the active photonic material to be combined with the existing photonic silicon and germanium devices in a single cohesive semiconductor fabrication process.

As illustrated in FIG. 1, a flowchart of a process for the manufacture of a laser utilizing the gain material of one embodiment of the present invention. In one embodiment of the present invention, a workpiece is configured from a silicon wafer upon which is disposed CMOS and optical components and an InP wafer bearing an epitaxy 112. The InP substrate is removed 114 mechanically, and the remaining InP is etched 116 from the epitaxy the using HCl. Oxide pads are deposited on the revealed epitaxy layer 118. The Oxide pads act as masks during a first pattern etch removing the epitaxy to the N level 120. Etching continues using a patterned Inductively Coupled Plasma (ICP) technique and additional pattern etching to isolate the device on the substrate (122-126). A cladding oxide is applied 128. Contacts are patterned 130 and applied 132, 134, 136 and the resulting device is treated according to standard back end processing techniques 138.

A similar embodiment is illustrated in FIGS. 2A-2M, block diagrams illustrating the stages of construction of an integrated gain device. In such an embodiment, a starting structure or workpiece, in one embodiment a 6 inch Silicon CMOS and Photonics wafer 20, is prepared, upon which an InP wafer 22 bearing an epitaxy 24 to the processed silicon wafer is performed. One skilled in the art will appreciate that depending on the devices 28 disposed on the CMOS wafer 20 planarization steps may be required before bonding of the epitaxy 24 to the wafer 20. The workpiece having the wafer 20, epitaxy 24 and InP layer 22 is then mechanically processed to remove substrate to a flat surface 26, in one embodiment this involves mechanically reducing the thickness of the InP 22 layer to 20 μm. After the InP layer 22 has been mechanically thinned, wet etching with HCl of the InP is carried out to remove the layer in its entirety exposing the epitaxy layer 24 etch stop. This epitaxy 24 is then patterned and etched further to first create a desired contact 32 and then to isolate the structure 30. The structure 30 is then metallized to create metal contacts 34 for the device 30. The structure 30 and is then coated with cladding oxide layers 36, in one embodiment SiO. This cladding 36 is then planarlized, vias 38 are cut filled and processed. The resulting structure is integrated in to a chip upon which may be disposed other devices 28, and interconnections such as vias and waveguides may be made to the gain device configured according to one embodiment of the present invention.

Such an embodiment employs existing photonic processing capabilities such as oxide deposition and Chemi-Mechanical polish (CMP) to provide a clean planar bond interface and ensure that the planarization is sufficient to deflect bonded wafer or die to eliminate any gaps resulting from direct contact between two surfaces with nonzero surface bow, warp, planarity, or roughness. The typical planarization specification of (10 nm/100 μm and 0.5 nm RMS) is well known to those skilled in the art.

Known processes will be combined with a surface activation process to modify the surface of one or both of the surfaces to be bonded. This chemical process consists of a standard RCA clean including a Sulfuric acid/Hydrogen peroxide etch and oxygen/Argon plasma process to remove organics from the surface. Following this, in order to achieve a strong bond at low temperatures one embodiment of the present invention will treat the surfaces prior bonding so that they are terminated by species that produce less or no water during the required polymerization reactions that occur during the interaction at the two surfaces.

One embodiment of the present invention provides $SiO_2$ surfaces treated in ammonium hydroxide ($NH_4OH$) solution prior to room-temperature bonding which can yield a stronger bond at low temperatures than those receiving only a standard RCA clean. The treated $SiO_2$ surfaces are terminated mainly by $NH_2$ and OH groups after the treatment:

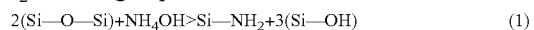

During room-temperature bonding, clusters of two or three $NH_3$ or HOH molecules will bridge between $NH_2$ or OH groups on the two mating surfaces. We will then employ low-temperature annealing to displace the $NH_3$ and HOH molecules. During this thermal step the following three reactions take place:

The hydrogen produced in Reaction 4 can diffuse away or dissolve in the surrounding oxide, and the strong Si—N bonds will remain. Overall, the three reactions result in a higher bonding energy of $SiO_2/SiO_2$ bonded pairs after annealing at low temperatures (e.g., 150° C.) than for standard RCA-treated $SiO_2/SiO_2$ bonded pairs. Once the CMOS surface has been prepared with this process, it is ready to accept placement of the epitaxy chiplet or wafer. Bonding, in one embodiment, is carried out in normal foundry ambient without need of a vacuum or inert gas environment. No applied pressure or electric field are used the surfaces are simply brought into contact. For wafer to wafer bonding from 4" to 8", the bond forms within seconds. For die to wafer applications, the bond is essentially instantaneous, enabling compatibility with conventional high-speed pick and place.

In one embodiment a laser diode is provided having an electromagnetic mode on the order of the size of the device, as such the horizontal and vertical confinement of optical and electrical field. Such features are not required in conventional laser design since such conventional lasers typically operate in a propagation mode where the operational wavelength is much smaller than the cavity.

In one embodiment of the optical gain material of the present invention, the confinement of the optical mode is provided by the use of materials having large variations not only in their index of refraction, but conductivity. This allows confinement of the electric field, allowing greater control over the interaction of electronic carriers with the active volume of our gain materials.

One embodiment of the present invention may be deployed in low power integrated micro-ring lasers that will employ a ring resonator format. Semiconductor ring resonator lasers offer a range of advantages over other geometries that require facets or other physical methods for optical feedback. These include:

Ease of integration, a lack of spatial hole burning due to traveling-wave operation and narrow line width single mode operation with high side mode rejection.

Operation with the lowest possible dimensional system enabling extremely strong confinement of the optical fields to a ridge waveguide structure with strong lateral guiding.

The continuous ring waveguide eliminates the need for any other optical feedback mechanism.

Semiconductor quantum well lasers that incorporate these low-dimensional photonic structures are far more efficient than the conventional laser structures because of a modification of the photonic density of states that enhances both the spatial and spectral coupling of spontaneous emissions into the desired lasing waveguide mode which we will control based on the high confinement nature of our optical integration scheme.

This coupling to the lasing modes is related as a constant referred to as the beta factor. The beta factor for our micro ring laser could be as large as 1, compared with 10-5 for conventional edge-emitting laser. This large beta value represents an increase in the effective gain of the cavity, making it possible to achieve lasing in a small cavity while maintaining a low lasing threshold.

For the modification of beta to be significant, the photons must be strongly confined. This can be achieved using strongly guided waveguides with cross-sectional dimensions smaller than an optical wavelength. Because of the strong guiding, very small cavities and micro-ring structures can be realized without significant bending losses. Additionally, light can be guided from one device to another evanescently, or transferred from one to another by waveguide coupling, eliminating the need for cleaved mirrors. These factors, together with their small size and low-threshold operation of micro-cavity lasers will enable the realization of ultra-high density photonic integrated circuits or VLSI photonics.

Some additional benefits of our micro-ring laser approach are:

Passive ring-resonator devices are good for wavelength filtering, routing, switching, modulation, and multiplexing/demultiplexing applications, an active stage ring would enable the compensation for losses in these structures.

Ring resonators do not require facets or gratings for optical feedback, making them particularly suited for monolithic integration with other components.

Adding gain to a ring resonator increases this scope by an order of magnitude adding massively scalar optical logic function, analog to digital conversion in the optical domain and enhanced optical signal processing.

Gain compensates for losses, increasing (multiplying) the Q of the resonator to unbelievably high numbers (millions, 10's of millions).

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for the integration of an optical gain material into a Complementary metal oxide semiconductor device, said method comprising the sequence of steps of:

Bonding an epitaxial layer grown on a InP substrate to a silicon wafer, thereby configuring a workpiece;

Mechanically removing a portion of said InP substrate;

Etching said InP remaining on epitaxial layer with hydrochloric acid;

Depositing at least one Oxide pad on revealed said epitaxial layer;

Using said Oxide pad as a mask during a first pattern etch removing the epitaxy to an N level;

Etching with a patterned inductively coupled plasma (ICP) technique;

Isolating the device on the substrate with additional pattern etching patterning contacts; and Applying said contacts.

* * * * *